(12) United States Patent
Nakagawa et al.

(10) Patent No.: US 6,345,334 B1
(45) Date of Patent: Feb. 5, 2002

(54) HIGH SPEED SEMICONDUCTOR MEMORY DEVICE CAPABLE OF CHANGING DATA SEQUENCE FOR BURST TRANSMISSION

(75) Inventors: Atsushi Nakagawa; Yoshiyuki Kato, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/225,464

(22) Filed: Jan. 6, 1999

(30) Foreign Application Priority Data

Jan. 7, 1998 (JP) .......................................... 10-001688

(51) Int. Cl.$^7$ .............................................. G06F 12/00
(52) U.S. Cl. ........................ 711/104; 711/105; 711/167
(58) Field of Search ................................ 711/104, 105, 711/167

(56) References Cited

U.S. PATENT DOCUMENTS

| | | | | |
|---|---|---|---|---|
| 5,255,378 A | * | 10/1993 | Crawford et al. | 710/127 |
| 5,390,149 A | * | 2/1995 | Vogley et al. | 365/189.01 |
| 5,526,320 A | * | 6/1996 | Zagar et al. | 365/233.5 |
| 5,715,476 A | * | 2/1998 | Kundu et al. | 710/35 |
| 5,903,496 A | * | 5/1999 | Kendall et al. | 365/185.12 |
| 5,973,989 A | * | 10/1999 | Pawloski | 365/233 |

FOREIGN PATENT DOCUMENTS

| | | |
|---|---|---|
| DE | 40 10 384 | 11/1995 |
| JP | 2-143983 | 6/1990 |
| JP | 4-184791 | 7/1992 |
| JP | 6-111561 | 4/1994 |
| JP | 9-153278 | 6/1997 |
| JP | 6-290582 | 6/1998 |
| JP | 10-255476 | 9/1998 |

* cited by examiner

*Primary Examiner*—Reginald G. Bragdon
(74) *Attorney, Agent, or Firm*—Young & Thompson

(57) ABSTRACT

The present invention provides a semiconductor memory device capable of writing data into a memory area and reading data from the memory area, wherein the semiconductor memory device has a circuit for switching sequences of unit data comprising plural bytes to be consecutively transmitted as a unit for at least one of data write or read operations, so that, in accordance with a designated address of a memory area, a corresponding datum of the unit data to the designated address is first transmitted, followed by a consecutive transmission of remaining data in a predetermined basic cyclic sequence, whereby if any address of the memory area is designated, then the unit data comprising the plural bytes are consecutively transmitted as a unit without intervening any operation of switching word lines connected to the memory area.

3 Claims, 4 Drawing Sheets

FIG. 2

| A0, A1 | counter output | EXOR | output data |
|--------|----------------|------|-------------|
| 0  0   | 0  0           | 0  0 | $D_0$       |
| 0  0   | 0  1           | 0  1 | $D_1$       |
| 0  0   | 1  0           | 1  0 | $D_2$       |
| 0  0   | 1  1           | 1  1 | $D_3$       |

| A0, A1 | counter output | EXOR | output data |
|--------|----------------|------|-------------|
| 0  1   | 0  0           | 0  1 | $D_1$       |
| 0  1   | 0  1           | 0  0 | $D_0$       |
| 0  1   | 1  0           | 1  1 | $D_3$       |
| 0  1   | 1  1           | 1  0 | $D_2$       |

| A0, A1 | counter output | EXOR | output data |
|--------|----------------|------|-------------|
| 1  0   | 0  0           | 1  0 | $D_2$       |
| 1  0   | 0  1           | 1  1 | $D_3$       |
| 1  0   | 1  0           | 0  0 | $D_0$       |
| 1  0   | 1  1           | 0  1 | $D_1$       |

| A0, A1 | counter output | EXOR | output data |
|--------|----------------|------|-------------|
| 1  1   | 0  0           | 1  1 | $D_3$       |
| 1  1   | 0  1           | 1  0 | $D_2$       |
| 1  1   | 1  0           | 0  1 | $D_1$       |
| 1  1   | 1  1           | 0  0 | $D_0$       |

HIGH SPEED SEMICONDUCTOR MEMORY DEVICE CAPABLE OF CHANGING DATA SEQUENCE FOR BURST TRANSMISSION

BACKGROUND OF THE INVENTION

The present invention relates to a semiconductor memory device, and more particularly to a high speed semiconductor memory device capable of changing data sequence for burst transmission for high speed data write and read operations.

One of the recent issues is a large difference in high speed performance between the advanced high speed central processing unit (CPU) and the dynamic random access memory (DRAM). In order to solve the above issue, it has been proposed to provide a cache memory between the CPU and the main memory such as the DRAM, so that the CPU is accessible to the cache memory. This cache memory has a smaller capacity than the main memory such as DRAM but is capable of high speed access for high speed data write and read operations. The cache memory has copy data as a part of the data stored in the main memory. These copy data comprise plural data sets, each of which comprises data corresponding to consecutive addresses are stored in individual blocks. The consecutive data sets are individually stored in the cache memory. The CPU has access to the cache memory for reading out the required copy data from the cache memory. If, however, the cache memory does not have the required copy data, the copy of the currently required data stored in the main memory is made in a free memory area of the cache memory, before the CPU may gain a second access to the free memory area of the cache memory for reading out the required copy data. If, however, the cache memory has no free memory area for storing any copy data, then data with a likely small degree of necessity are transferred from the cache memory to the main memory in order to form a free memory area for making copy data of the currently required data in the main memory in the free memory area of the cache memory, before the CPU has access to the cache memory for reading out the required copy data from the cache memory.

It is, therefore, required for the main memory to have a high speed access to the cache memory for high speed writing and reading a data column corresponding to consecutive addresses. Responsive to this requirement, the DRAM has been improved for conducting a burst transmission of data corresponding to consecutive addresses, wherein only a head address is designated for writing and reading operations of this head address data in combination with subsequent data corresponding to the consecutive addresses following the head address in the form of a data column synchronized with an externally supplied reference clock signal. Synchronous DRAM and high speed static random access memory (SRAM) are the conventionally improved main memories capable of burst transmission. A length of the data column for burst transmission is the burst length.

Usually, a general-purpose DRAM which has a first page mode transmits data sequentially so that a datum has been transmitted before a next datum is transmitted. The datum transmission speed of the advanced general-purpose DRAM is only 20 ns at 50 MHz. In the meantime, the synchronous DRAM takes almost the same time to conduct the datum transmission for writing and reading a datum as the advanced general-purpose DRAM. Notwithstanding, the synchronous DRAM is capable of multiplexing internal processings for concurrent writing and reading operations of a set of plural data so as to shorten an apparent data transmission time, so that the data transmission is carried out at an effective transmission speed corresponding to the frequency of the reference clock signal of 100 MHz or higher which is called the burst transmission frequency.

Meanwhile, the pre-fetch system is effective to increase the data input or output speed with multiplication of the internal processings of the main memory. In this pre-fetch system, the memory carries out in parallel the same plural internal processes of the plural data sets. The data input is carried out sequentially, for which reason data sequentially inputted or entered are temporally latched to accumulate the same amount of data as can be processed in the parallel internal processings for carrying out in parallel the same plural internal processes of the plural data sets, wherein the number of data to be temporally latched is equal to the number of the parallel internal processings. The parallel internal processings individually need individual reference clock signals, for which reason there are needed the same number of the reference clock signals as the parallel internal processings.

The above conventional pre-fetch system semiconductor memory device has the following problems. In order to conduct the burst transmission of data per n-byte unit, a less significant bit of the head address and a counted number of the clocks are added to each other for carrying out the write and read operations of the data in n-byte units. In this case, the data to be read out comprise the head address datum and subsequent (n−1)-byte data having the consecutive addresses following the head address. For example, it is now considered that four bytes are read from the n-bytes data D0–Dn−1. If D0 is designated as the head address, then data D0–D3 are read. If D1 is designated as the head address, then data D1–D4 are read. If D2 is designated as the head address, then data D2–D5 are read. If Dk is designated as the head address, then data Dk–Dk+3 are read, where k is 0 to n−4.

It is further assumed that a memory cell array for storing data comprises four blocks which are connected to common word lines. In order to read data D0–D3, it is necessary to designate the same common word line. In order to read data D1–D4, it is necessary to designate both a first common word line for reading the data D1–D3 and subsequently a second common word line for reading the datum D4. Namely, the first common word line commonly connected to memory cells storing the data D1–D3 is activated to read the data D1–D3 before the first common word line enters into an inactivated state and then the second common word line connected to a memory cell storing the datum D4 is selected and further a bit line connected to that memory cell comes out of the pre-charge state so as to allow a sense amplifier to activate the word line connected to the memory cell storing the datum D4 for reading the datum D4. During the processes for switching the word lines, the CPU contacts the wait processings. The processes for reading the data D1–D4 are more complicated than the process for reading the data D0–D3. Those descriptions are common and applicable to the writing operations.

The necessary time for writing and reading consecutive data corresponding to the consecutive addresses depends upon whether the common word line connected to the memory cells storing a part of the consecutive data is switched into the different common word line connected to the memory cells storing the remaining part of the consecutive data. If necessary, the necessary time for writing and reading the consecutive data would largely depend upon the necessary time for the above word line switching operations. This makes it difficult to realize the increased high speed performance of the semiconductor memory device.

In the above circumstances, it had been required to develop a novel high speed semiconductor memory device for burst transmission for high speed data write and read operations.

SUMMARY OF THE INVENTION

Accordingly, it is an object of the present invention to provide a novel semiconductor memory device free from the above problems.

It is a further object of the present invention to provide a novel high speed semiconductor memory device for burst transmission for high speed data write and read operations.

The present invention provides a method of switching sequences of unit data comprising plural bytes to be consecutively transmitted as a unit for at least one of data write or read operations, wherein, in accordance with a designated address of a memory area, any sequences of the unit data are so switched that a corresponding datum of the unit data to the designated address is first transmitted, followed by a consecutive transmission of remaining data in a predetermined basic cyclic sequence, so that if any address of the memory area is designated, then the unit data comprising the plural bytes are consecutively transmitted as a unit without switching word lines connected to the memory area.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

FIG. 2 is a table illustrative of how operation of the data sequence switching circuit switches the sequences of the 4-byte data in accordance with the calculated logic value "EXOR".

DESCRIPTION OF THE PREFERRED EMBODIMENTS

Figure 1:
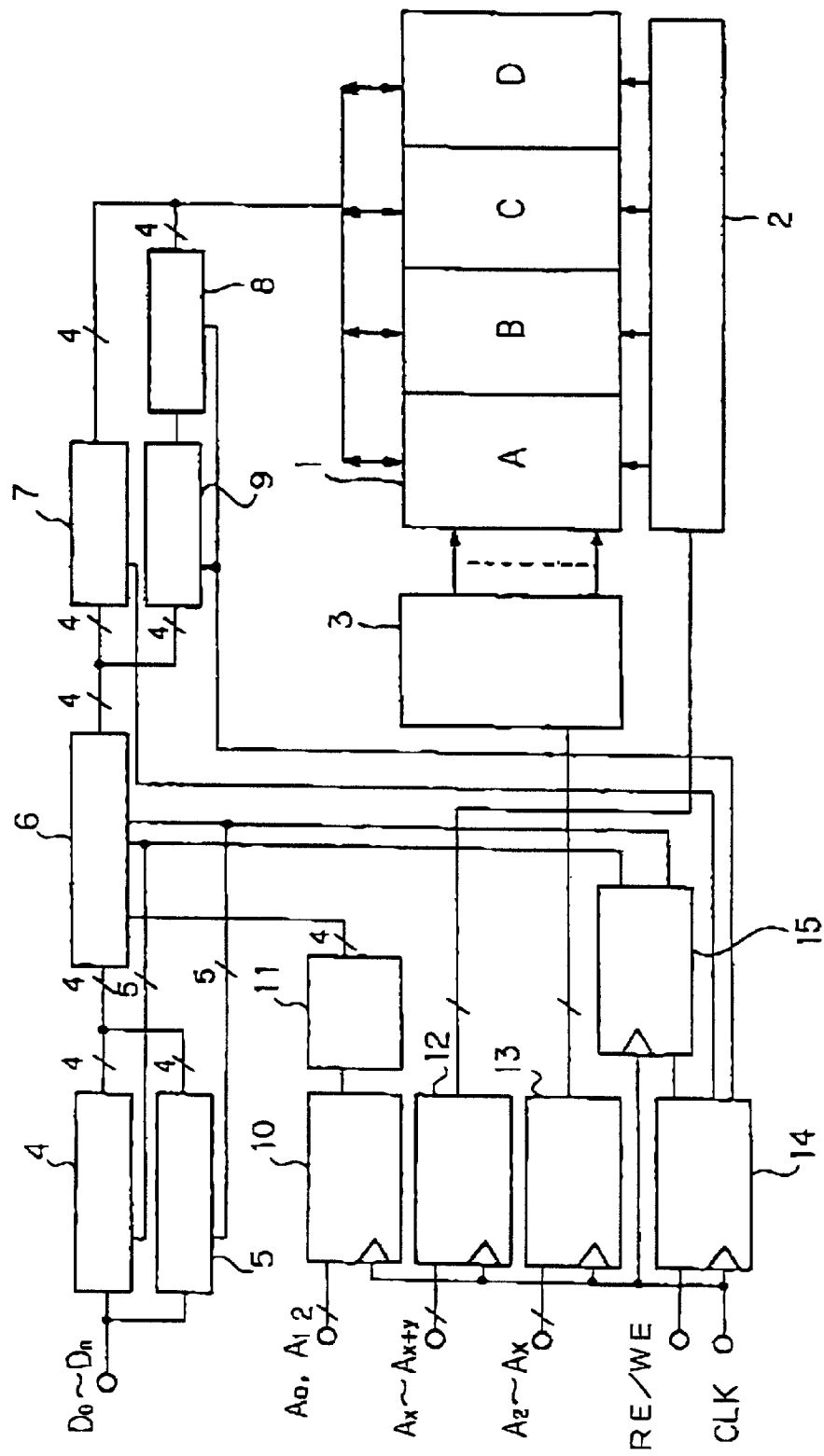
FIG. 1 is a block diagram illustrative of a first novel semiconductor memory device operable in a pre-fetch system for burst transmission of data in 4-byte units in a first embodiment in accordance with the present invention.

The first aspect of the present invention provides a method of switching sequences of unit data comprising plural bytes to be consecutively transmitted as a unit for at least one of data write or read operations, wherein, in accordance with a designated address of a memory area, any sequences of the unit data are so switched that a corresponding datum of the unit data to the designated address is first transmitted, followed by a consecutive transmission of remaining data in a predetermined basic cyclic sequence, so that if any address of the memory area is designated, then the unit data comprising the plural bytes are consecutively transmitted as a unit without switching word lines connected to the memory area.

It is preferable that the predetermined basic cyclic sequence is defined to be a sequence in which the youngest address number in the unit data is designated.

It is also preferable that a possible number of the plural bytes constituting the unit data is $2^i$, provided i is a natural number.

It is also preferable that any sequences of the unit data are so switched in accordance with logic values of EXOR between the designated address and counted values of clocks, provided that a counting operation of the clocks is carried out in a cycle of the same number as the plural bytes.

It is further preferable that if the number of the plural bytes constituting the unit data is "m", then the designated address is given by less significant bits of a head address, provided that the number of the less significant bits is given by $\log_2 m$.

It is also preferable that any sequences of the unit data are switched by switching operations of a plurality of switching devices inter-connected to each other to form a network having plural signal paths, any one of which is selectable in accordance with the designated address, provided that if the number of the plural bytes constituting the unit data is "m", then the designated address is given by less significant bits of a head address where the number of the less significant bits is given by $\log_2 m$, and the number of the switching devices is given by $m^2$.

The second aspect of the present invention provides a semiconductor memory device capable of writing data into a memory area and reading data from the memory area, wherein the semiconductor memory device has a circuit for switching sequences of unit data comprising plural bytes to be consecutively transmitted as a unit for at least one of data write or read operations, so that, in accordance with a designated address of a memory area, a corresponding datum of the unit data to the designated address is first transmitted, followed by a consecutive transmission of remaining data in a predetermined basic cyclic sequence, whereby if any address of the memory area is designated, then the unit data comprising the plural bytes are consecutively transmitted as a unit without switching word lines connected to the memory area.

The third aspect of the present invention provides a semiconductor memory device comprising: a memory cell array; a write-data latch circuit for receiving input data time-sequentially inputted in synchronizing with a clock signal externally supplied so that the write-data latch circuit carries out a parallel output of a plurality of unit data comprising plural bytes; a clock counter for counting clocks externally supplied; an address decoder for decoding less significant bits of a head address of addresses corresponding to the input data; a data-sequence switching circuit being connected to the clock counter for receiving counted clock values from the clock counter, the data-sequence switching circuit being connected to the address decoder for receiving decoded less significant bits from the address decoder, and the data-sequence switching circuit being also connected to the write-data latch circuit for receiving the parallel output of the unit data comprising plural bytes, so as to switch sequences of the unit data comprising plural bytes to be consecutively transmitted as a unit, so that, in accordance with the decoded less significant bits and the counted clock values, a corresponding datum of the unit data to an address designated by the decoded less significant bits is first transmitted, followed by a consecutive transmission in a predetermined basic cyclic sequence of remaining data of the unit data, whereby if any address is designated, then the unit data comprising the plural bytes are consecutively transmitted as a unit to the memory cell array without intervening any operation of switching word lines connected to the memory area for writing the data into the memory cell array, and also the data-sequence switching circuit is operated to switch sequences of read unit data consecutively transmitted as a unit from the memory cell array, so that, in accordance with the decoded less significant bits and the counted clock values, a corresponding datum of the read unit data to an address designated by the decoded less significant bits for reading operation is first outputted from the data-sequence switching circuit, followed by a consecutive output in the predetermined basic cyclic sequence of remaining data of the read unit data, whereby if any address is designated, then the read unit data comprising the plural bytes are consecutively transmitted as a unit from the memory cell array without intervening any operation of switching the word lines for reading the data from the memory cell array; and a read-data latch circuit being connected to the data-sequence switching circuit for receiving outputs from the data-sequence switching circuit to realize a time-sequential output of the read data in synchronizing with the clock signal.

The fourth aspect of the present invention provides a semiconductor memory device comprising: a memory cell array; a write-data latch circuit for receiving input data time-sequentially inputted in synchronizing with a clock signal externally supplied so that the write-data latch circuit carries out a parallel output of a plurality of unit data comprising plural bytes; a clock counter for counting clocks externally supplied; an address decoder for decoding less significant bits of a head address of addresses corresponding to the input data; a data-sequence switching circuit being connected to the clock counter for receiving counted clock values from the clock counter, the data-sequence switching circuit being connected to the address decoder for receiving decoded less significant bits from the address decoder, and the data-sequence switching circuit being also connected to the write-data latch circuit for receiving the parallel output of the unit data comprising plural bytes, so as to switch sequences of the unit data comprising plural bytes to be consecutively transmitted as a unit, so that, in accordance with the decoded less significant bits and the counted clock values, a corresponding datum of the unit data to an address designated by the decoded less significant bits is first transmitted, followed by a consecutive transmission in a predetermined basic cyclic sequence of remaining data of the unit data, whereby if any address is designated, then the unit data comprising the plural bytes are consecutively transmitted as a unit to the memory cell array without intervening any operation of switching word lines connected to the memory area for writing the data into the memory cell array; a read-data latch circuit being connected to the memory cell array for receiving read unit data consecutively transmitted as a unit from the memory cell array; and a data-sequence control circuit being connected to the clock counter for receiving the counted clock values from the clock counter, the data-sequence switching circuit being also connected to the address decoder for receiving the decoded less significant bits from the address decoder, the data-sequence control circuit being also connected to the read-data latch circuit for switching sequences of the read unit data in the read-data latch circuit, so that, in accordance with the decoded less significant bits and the counted clock values, a corresponding datum of the read unit data to an address designated by the decoded less significant bits for reading operation is first outputted from the read-data latch circuit, followed by a consecutive output in the predetermined basic cyclic sequence of remaining data of the read unit data, whereby if any address is designated for reading operation, then the read unit data comprising the plural bytes are consecutively transmitted as a unit from the memory cell array without intervening any operation of switching the word lines for reading the data from the memory cell array, thereby to realize a time-sequential output of the read data from the read-data latch circuit in synchronizing with the clock signal.

A first embodiment according to the present invention will be described in detail with reference to FIG. 1. Notwithstanding, the number of the unit bytes may be changed to $2^i$, where "i" is a natural number. The semiconductor memory device has a memory cell array 1 comprising a plurality of memory cells for allowing write and read operations of data in 4-byte units (A, B, C and D). The descriptions will be made assuming that plural bits (A0, A1, A2, A3 - - - Ay) correspond to the head address of the required data to be written or read, wherein A0 is the least significant bit whilst Ay is the most significant bit. The semiconductor memory device also has a first address buffer 13 for receiving intermediate significant bits (A2, A3, - - - Ax) transmitted through an external bus (not illustrated). The semiconductor memory device also has a second address buffer 12 for receiving more significant bits (Ax+1, Ax+2, - - - Ay) transmitted through the external bus. The semiconductor memory device also has a third address buffer 10 for receiving less significant bits (A0 and A1) transmitted through the external bus. The semiconductor memory device also has a column decoder 2 which is connected to an output terminal of the second address buffer 12 for receiving the more significant bits (Ax+1, Ax+2, - - - Ay) from the second address buffer 12 so that the column decoder 2 is operated to decode the more significant bits (Ax+1, Ax+2, - - - Ay) into decoded bit line selecting data. The column decoder 2 is also connected to bit lines connected to the memory cells of the memory cell array 1 for selecting bit lines designated in accordance with the decoded bit line selecting data.

The semiconductor memory device also has a row decoder 3 which is connected to an output terminal of the first address buffer 13 for receiving the intermediate significant bits (A2, A3, - - - Ax) from the first address buffer 13 so that the row decoder 3 is operated to decode the intermediate significant bits (A2, A3, - - - Ax) into decoded word line selecting data. The row decoder 3 is also connected to word lines connected to the memory cells of the memory cell array 1 for selecting word lines designated in accordance with the decoded word line selecting data.

The semiconductor memory device also has a write operation purpose latch circuit 4 for receiving sequential transmission of consecutive data D0, D1, D2, D3, - - - Dn which have been time-sequentially transmitted through an external data bus not illustrated, where "n" is the natural number, so that the write operation purpose latch circuit 4 is operated to latch the consecutive data D0, D1, D2, D3, - - - Dn in synchronization with externally supplied reference clock signals for outputting parallel data in 4-byte units from the write operation purpose latch circuit 4.

The semiconductor memory device also has a decoder 11 which is connected to an output terminal of the third address buffer 10 for receiving the less significant bits (A0 and A1) from the third address buffer 10, so that the decoder 11 is operated to decode the less significant bits (A0 and A1) into decoded address data.

The semiconductor memory device also has a write amplifier 7 which is connected to the bit lines connected to the memory cells of the memory cell array 1 so that the write amplifier 7 is operated to write data in 4-byte units into the designated memory cells.

The semiconductor memory device also has a sense amplifier 8 which is connected to the bit lines connected to the memory cells of the memory cell array 1 so that the sense amplifier 8 is operated to read data in 4-byte units from the designated memory cells.

The semiconductor memory device also has a data buffer 9 which is connected to the sense amplifier 8 for receiving the read data in 4-byte units and amplification of the data. The semiconductor memory device also has a read operation purpose latch circuit 5 for receiving the read data in 4-byte units from the designated memory cells, so that the read operation purpose latch circuit 5 is operated to latch the read data for every 4-byte unit in synchronization with the reference clock signals for time-sequential outputs of consecutive data from the read operation purpose latch circuit 5.

The semiconductor memory device also has a read/write control circuit 14 for generating control signals to switch read and write operations. The read/write control circuit 14 is connected to the write amplifier 7, the sense amplifier 8 and the data buffer 9 to send the control signals thereto.

The semiconductor memory device also has a counter 15 for receiving the externally supplied reference clock signals for counting operation thereof to obtain a counted value 0, 1, 2, or 3 and further decode the counted value 0, 1, 2, or 3. The counter 15 is connected to the read/write control circuit 14 for receiving the control signal from the read/write control circuit 14. The counter 15 is also connected through five signal lines to the write operation purpose latch circuit 4 and the read operation purpose latch circuit 5 for sending the decoded count value and the control signal to the write operation purpose latch circuit 4 and the read operation purpose latch circuit 5.

Further, the semiconductor memory device has a data sequence switching circuit 6 for switching the sequence of 4-byte data. The data sequence switching circuit 6 is connected to the counter 15 for receiving the decoded count value and the control signal from the counter 15 and also connected to the decoder 11 for receiving the decoded address data from the less significant bits (A0 and A1), so that the data sequence switching circuit 6 is operated to switch the sequence of 4-byte data in accordance with the decoded address data, the decoded count value and the control signal. The data sequence switching circuit 6 is also connected to the write operation purpose latch circuit 4 and the read operation purpose latch circuit 5 as well as connected to the write amplifier 7 and the data buffer 9.

For the write operation, the data sequence switching circuit 6 receives the parallel data in 4-byte units from the write operation purpose latch circuit 4 for switching the sequence of 4-byte data in accordance with the decoded address data and the decoded count value, so that the data sequence switching circuit 6 transmits the sequence-switched 4-byte data to the write amplifier 7. For the read operation, the data sequence switching circuit 6 receives the read data in 4-byte units from the data buffer 9 for switching the sequence of 4-byte read data in accordance with the decoded address data and the decoded count value, so that the data sequence switching circuit 6 transmits the sequence-switched 4-byte read data to the read operation purpose latch circuit 5.

In the above descriptions, all of the data have been stored in the write operation purpose latch circuit 4 before the data sequence switching circuit 6 is operated to switch the sequences of the data. Notwithstanding, it may alternatively be possible to designate data latching positions in registers (not illustrated) at the same time when the data are stored in the write operation purpose latch circuit 4, so that the 4-byte data are latched for subsequent direct transmission of the output from the write operation purpose latch circuit 4 to the write amplifier 7 in order to provide substantially the same effect as switching the sequences of the data, whereby the data are written into the memory cell array 1 with reduced number of the clocks.

The following description will focus on the operation of the above semiconductor memory device. The consecutive data D0, D1, D2, D3, - - - Dn are inputted into an input terminal of the semiconductor memory device synchronously with externally supplied reference clock signals, wherein the input terminal is connected to the write operation purpose latch circuit 4 and the read operation purpose latch circuit 5. The write operation purpose latch circuit 4 receives the sequential transmission of the consecutive data D0, D1, D2, D3, - - - Dn, so that the write operation purpose latch circuit 4 is operated to convert the consecutive data D0, D1, D2, D3, - - - Dn into parallel data in 4-byte units. The data sequence switching circuit 6 receives the parallel data in 4-byte units for switching the sequence of the 4-byte data in accordance with the decoded address data from the decoder 11 and the decoded count value from the counter 15. The data sequence switching circuit 6 transmits the sequence-switched 4-byte data to the write amplifier 7, so that the write amplifier 7 is operated to write the sequence-switched 4-byte data into the memory cells designated by the column decoder 2 and the row decoder 3.

In the meantime, for the read operation, the sense amplifier 8 is operated to read data in 4-byte units from the designated memory cells. The data buffer 9 connected to the sense amplifier 8 receives the read data in 4-byte units for amplification of the data. The data buffer 9 transmits the amplified read data in 4-byte units to the data sequence switching circuit 6. The data sequence switching circuit 6 receives the read data in 4-byte units from the data buffer 9, so that the data sequence switching circuit 6 is operated to switch the sequence of the 4-byte read data in accordance with the decoded address data from the decoder 11 and the decoded count value from the counter 15, so that the data sequence switching circuit 6 transmits the sequence-switched 4-byte read data to the read operation purpose latch circuit 5. The read operation purpose latch circuit 5 is operated to latch the read data for every 4-byte unit for time-sequential outputs of consecutive data from the read operation purpose latch circuit 5 in synchronization with the reference clock signals.

The read/write control circuit 14 generates such control signals that the sense amplifier 8 is operated to read the next data from the memory cell array 1 during the switching operation to the 4-byte data by the data sequence switching circuit 6, and the read data are latched by the sense amplifier 8.

The operation of switching the sequence of the 4-byte data by the data sequence switching circuit 6 will be described. The data sequence switching circuit 6 is operated to calculate a logic value "EXOR" of both the less significant bits (A0 and A1) of the head address from the decoder 11 and the decoded count value from the counter 15 so that the data sequence switching circuit 6 switches the sequences of the 4-byte data in accordance with the calculated logic value "EXOR". FIG. 2 is a table illustrative of how operation of the data sequence switching circuit switches the sequences of the 4-byte data in accordance with the calculated logic value "EXOR". It is assumed that the 4-byte data "D0, D1, D2 and D3" are inputted into the data sequence switching circuit 6. The decoded count values from the counter 15 into the data sequence switching circuit 6 are always changed in the order of (0, 0), (0, 1), (1, 0) and (1, 1). If the less significant bits (A0 and A1) of the head address are (0, 0), then the logic value "EXOR" are changed in the order of (0, 0), (0, 1), (1, 0) and (1, 1) by changing the decoded count values of (0, 0), (0, 1), (1, 0) and (1, 1), whereby data output from the data sequence switching circuit 6 are in the order of D0, D1, D2, D3. If the less significant bits (A0 and A1) of the head address are (0, 1), then the logic value "EXOR" are changed in the order of (0, 1), (0, 0), (1, 1) and (1, 0) by changing the decoded count values of (0, 0), (0, 1), (1, 0) and (1, 1), whereby data output from the data sequence switching circuit 6 are in the order of D1, D0, D3, D2. If the less significant bits (A0 and A1) of the head address are (1, 0), then the logic value "EXOR" are changed in the order of (1, 0), (1, 1), (0, 0) and (0, 1) by changing the decoded count values of (0, 1), (0, 0), (1, 1) and (1, 0), whereby data output from the data sequence switching circuit 6 are in the order of D2, D3, D0, D1. If the less significant bits (A0 and A1) of the head address are (1, 1), then the logic value "EXOR" are changed in the order of (1, 1), (1, 0), (0, 1) and (0, 0) by changing the decoded count values of (0, 1), (0, 0), (1, 1) and (1, 0), whereby data output from the data sequence switching circuit 6 are in the order of D3, D2, D1, D0.

The above sequence-switched 4-byte data are written into an address designated by the less significant bits (A0 and A1) of the head address. It is assumed that an area "A" of the memory cell array 1 is allocated in order with "address 0", "address 4" and "address 8", and an area "B" of the memory cell array 1 is allocated in order with "address 1", "address 5" and "address 9", and an area "C" of the memory cell array 1 is allocated in order with "address 2", "address 6" and "address 10", and an area "D" of the memory cell array 1 is allocated in order with "address 3", "address 6" and "address 11". If the less significant bits (A0 and A1) of the head address are (1, 0) to designate the "address 2", then the data "D2" is stored into the area "C" of the memory cell array 1, and the data "D3" is stored into the area "D" of the memory cell array 1, and the data "D0" is stored into the area "A" of the memory cell array 1, and the data "D1" is stored into the area "B" of the memory cell array 1. As described here, even if the data D0, D1, D2, D3 are inputted in any sequences, then the data sequence switching circuit 6 switches the sequence of the data D0, D1, D2, D3 so that the individual data D0, D1, D2, D3 are stored into the areas "A", "B", "C" and "D" corresponding to those addresses.

The subsequent description will be directed to the data read operation of the semiconductor memory device. If the less significant bits (A0 and A1) of the head address are (0, 0) to designate the "address 0", then the data D0 stored in the area "A" of the memory cell array 1 is first outputted, and then the data D1 stored in the area "B" of the memory cell array 1 is outputted, and subsequently the data D2 stored in the area "C" of the memory cell array 1 is outputted, and finally the data D3 stored in the area "D" of the memory cell array 1 is outputted. If the less significant bits (A0 and A1) of the head address are (0, 1) to designate the "address 1", then the data D1 stored in the area "B" of the memory cell array 1 is first outputted, and then the data D0 stored in the area "A" of the memory cell array 1 is outputted, and subsequently the data D3 stored in the area "D" of the memory cell array 1 is outputted, and finally the data D2 stored in the area "C" of the memory cell array 1 is outputted. If the less significant bits (A0 and A1) of the head address are (1, 0) to designate the "address 2", then the data D2 stored in the area "C" of the memory cell array 1 is outputted, and then the data D3 stored in the area "D" of the memory cell array 1 is outputted, and subsequently the data D0 stored in the area "A" of the memory cell array 1 is outputted, and finally the data D1 stored in the area "B" of the memory cell array 1 is outputted. If the less significant bits (A0 and A1) of the head address are (1, 1) to designate the "address 3", then the data D3 stored in the area "D" of the memory cell array 1 is first outputted, and then the data D2 stored in the area "C" of the memory cell array 1 is outputted, and subsequently the data D1 stored in the area "B" of the memory cell array 1 is outputted, and finally the data D0 stored in the area "A" of the memory cell array 1 is outputted. As described here, even if any address is designated, then the data corresponding to any designated address is first outputted.

In the above embodiment, the 4-byte data are concurrently written into and read out from the memory cell array 1. Namely, the number of the data concurrently written into and read out from the memory cell array 1 is four. If m-byte data are concurrently written into and read out from the memory cell array 1 or the number of the data concurrently written into and read out from the memory cell array 1 is "m", then the data sequence switching circuit 6 is operated to calculate the exclusive OR of both the less significant bits and the output from the clock counter, wherein the number of the less significant bits is defined to be $\log_2 m$, so as to decide the output sequences of the data in accordance with the calculated logic value "EXOR".

If, as described above, the data D0, - - - Dn are read out in the 4-byte units by the CPU (not illustrated), then available units or sets of data for being concurrently written into or read out from the memory cell array 1 are fixed to be D0 to D3, D4 to D7, and Dn–3 to Dn, provided that the available units or sets of data for being concurrently written into or read out from the memory cell array 1 are such that switching of the word lines is not necessary.

In accordance with the present invention, the data of the next set are stored into the sense amplifier 8 during when the data sequence switching circuit 6 is operated to switch the sequences of the data of the previous set and subsequently the read operation purpose latch circuit 5 latches the sequence-switched data of the previous set, for which reason the CPU is permitted to continuously fetch the data, thereby increasing a freedom of the external data bus.

The data sequence switching circuit 6 utilizes a simple logic operation to switch the sequences of the data, for which reason a high speed processing is realizable even if the number of the bytes of the data to be burst-transmitted.

Figure 3:
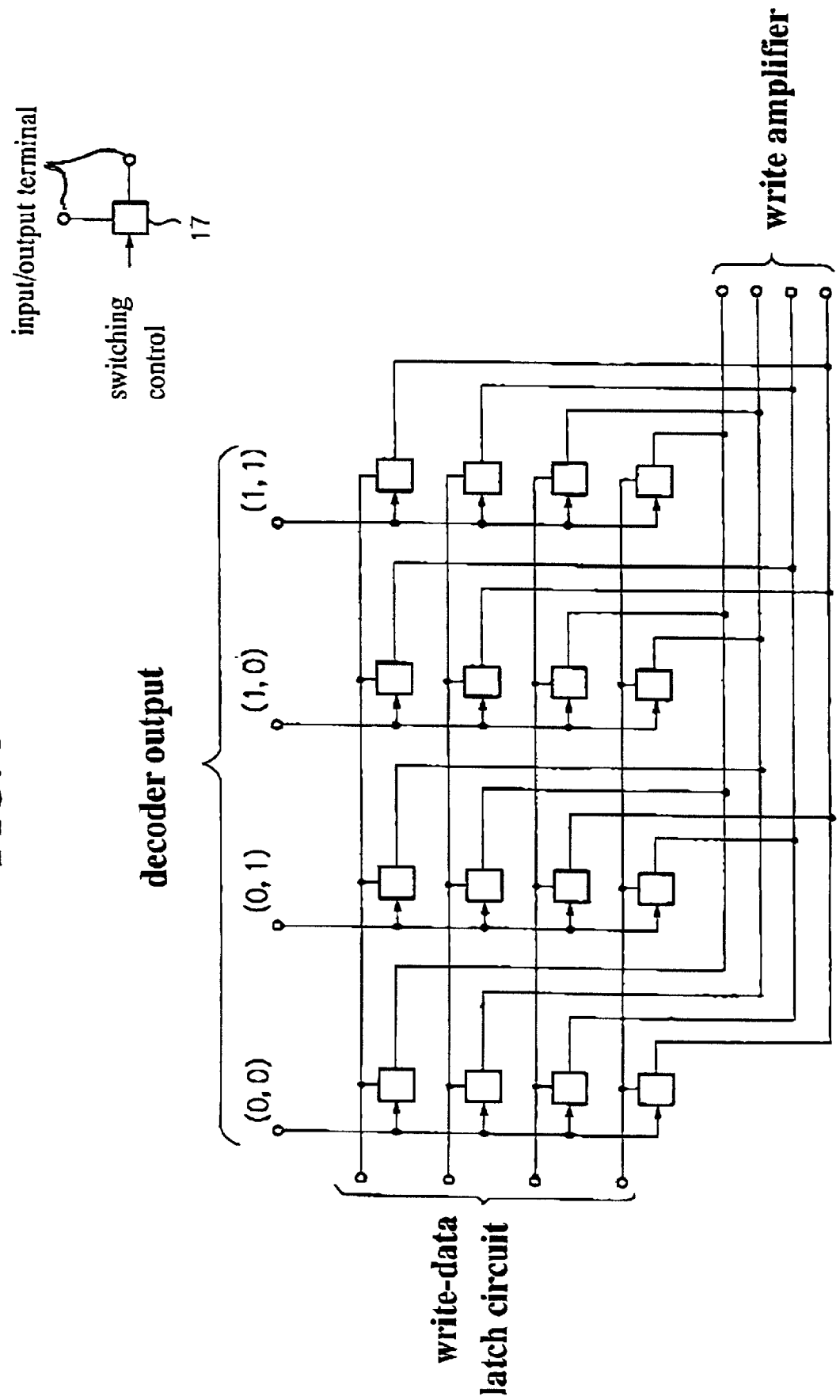
FIG. 3 is a diagram illustrative of an alternative structure of the data sequence switching circuit which comprises a switching network comprising a plurality of switches, each of which has input and output paths previously set.

As a first modification, as illustrated in FIG. 3, the data sequence switching circuit 6 may comprise a switching network comprising a plurality of switches 17, each of which has input and output paths previously set, so that the switching network is capable of selecting any one of plural patterns in accordance with the decoded data of the less significant bits, for example, (A0, A1). Namely, in this case, the data sequence switching circuit 6 does not need the clock counted value to select any one of the plural patterns. The switching network has such a configuration that the data are outputted in the same sequences as when the sequences in output of the data are determined in accordance with the logic values "EXOR" of the less significant bits and the output from the clock counter 15. If m-byte data are concurrently written into and read out from the memory cell array 1 or the number of the data concurrently written into and read out from the memory cell array 1 is "m", then the number of the necessary switches 17 is $m^2$. The increase in the number of the data concurrently written into and read out from the memory cell array 1 results in an exponential increase in the number of the necessary switches 17. Notwithstanding, in accordance with the above embodiment, the single data sequence switching circuit 6 is commonly used for both write and read operations to reduce the occupied area of the circuit. The switch 17 may comprise either a single transistor or transfer gates or logic gates.

In accordance with the above embodiment, the read data are transmitted from the sense amplifier 8 through the data buffer 9 to the data sequence switching circuit 6. It is possible to temporarily latch the data in the data buffer 9 before transmission into the data sequence switching circuit 6. In this case, it is possible to prepare the operation of reading the data from the memory cells connected to the word lines during when the data sequence switching circuit 6 is operated to switch the sequences of the data.

In accordance with the above embodiment, even if the CPU needs only the datum D3, then the consecutive data D0, D1, D2 and D3 are concurrently outputted. Notwithstanding, the CPU is allowed to ignore the data D0, D1, D2 or to make a copy of the data D0, D1, D2 in a primary cache memory accommodated in the CPU.

The above novel semiconductor memory device provides the following advantages.

The data sequence switching circuit 6 is operated to switch the sequences of the data concurrently written into and read out from the memory cell array so that the CPU is allowed to first fetch the data designated by the less significant bits of the head address and subsequent consecutive fetching of the remaining data in the switched sequences without, however, switching the selected word line.

The data sequence switching circuit 6 is commonly used for both the data write and read operations to reduce the necessary circuit scale.

The data sequence switching circuit 6 shows a simple logic operation of calculating the EXOR of the less significant bits of the head address and the output from the clock counter, wherein the number of the less significant bits is decided to be $\log_2 m$, so that the data sequence switching circuit 6 decides the sequences of the data in accordance with the calculated "EXOR".

The data of the next set are stored into the sense amplifier 8 during when the data sequence switching circuit 6 is operated to switch the sequences of the data of the previous set and subsequently the read operation purpose latch circuit 5 latches the sequence-switched data of the previous set, so that the CPU is permitted to continuously fetch the data without waiting operation, thereby increasing a freedom of the external data bus.

Figure 4:
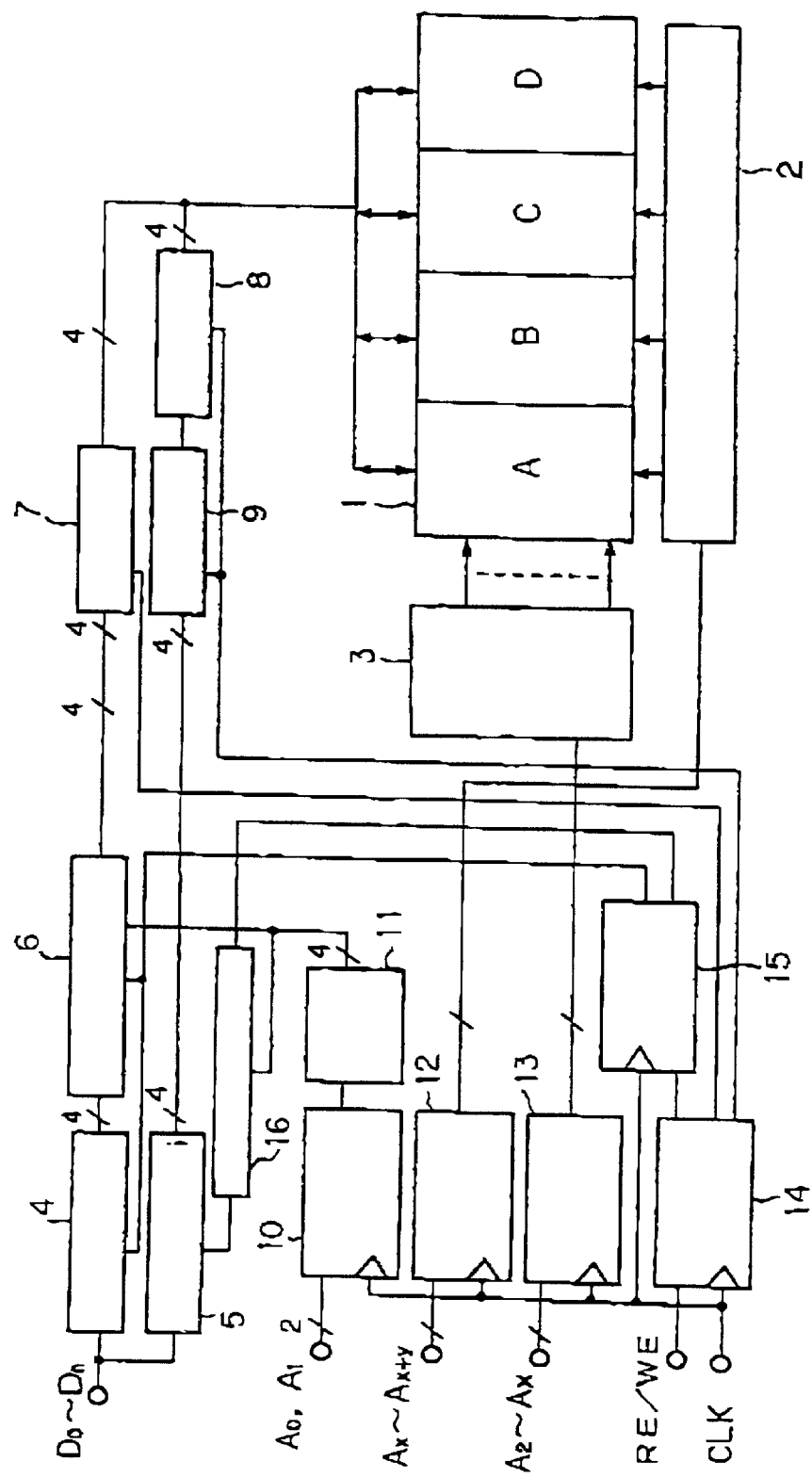
FIG. 4 is a block diagram illustrative of a second novel semiconductor memory device operable in a pre-fetch system for burst transmission of data in 4-byte units in a second embodiment in accordance with the present invention.

A second embodiment according to the present invention will be described in detail with reference to FIG. 4 which is a block diagram illustrative of a second novel semiconductor memory device operable in a pre-fetch system for burst transmission of data in 4-byte units. Notwithstanding, the number of the unit bytes may be changed to $2^i$, where "i" is the natural number. The second embodiment is different from the first embodiment in that the data sequence switching circuit is provided for switching the sequences of the data in the data write operation whilst a data sequence control circuit is also provided for switching the sequences of the data in the data read operation, so that even if the number of the data concurrently written into or read out from the memory cell array is increased, then any increase in the necessary area of the data sequence switching circuit may be suppressed.

The semiconductor memory device has a memory cell array 1 comprising a plurality of memory cells for allowing write and read operations of data in 4-byte units (A, B, C and D). The description will be made assuming that plural bits (A0, A1, A2, A3 - - - Ay) correspond to the head address of the required data to be written or read, wherein A0 is the least significant bit whilst Ay is the most significant bit. The semiconductor memory device also has a first address buffer 13 for receiving intermediate significant bits (A2, A3, - - - Ax) transmitted through an external bus (not illustrated). The semiconductor memory device also has a second address buffer 12 for receiving more significant bits (Ax+1, Ax+2, - - - Ay) transmitted through the external bus.

The semiconductor memory device also has a third address buffer 10 for receiving less significant bits (A0 and A1) transmitted through the external bus. The semiconductor memory device also has a column decoder 2 which is connected to an output terminal of the second address buffer 12 for receiving the more significant bits (Ax+1, Ax+2, - - - Ay) from the second address buffer 12 so that the column decoder 2 is operated to decode the more significant bits (Ax+1, Ax+2, - - - Ay) into decoded bit line selecting data. The column decoder 2 is also connected to bit lines connected to the memory cells of the memory cell array 1 for selecting bit lines designated in accordance with the decoded bit line selecting data.

The semiconductor memory device also has a row decoder 3 which is connected to an output terminal of the first address buffer 13 for receiving the intermediate significant bits (A2, A3, - - - Ax) from the first address buffer 13 so that the row decoder 3 is operated to decode the intermediate significant bits (A2, A3, - - - Ax) into decoded word line selecting data. The row decoder 3 is also connected to word lines connected to the memory cells of the memory cell array 1 for selecting word lines designated in accordance with the decoded word line selecting data.

The semiconductor memory device also has a write operation purpose latch circuit 4 for receiving sequential transmission of consecutive data D0, D1, D2, D3, - - - Dn which have been time-sequentially transmitted through an external data bus (not illustrated), where "n" is the natural number, so that the write operation purpose latch circuit 4 is operated to latch the consecutive data D0, D1, D2, D3, - - - Dn in synchronization with externally supplied reference clock signals for outputting parallel data in 4-byte units from the write operation purpose latch circuit 4.

The semiconductor memory device also has a decoder 11 which is connected to an output terminal of the third address buffer 10 for receiving the less significant bits (A0 and A1) from the third address buffer 10, so that the decoder 11 is operated to decode the less significant bits (A0 and A1) into decoded address data. The semiconductor memory device also has a write amplifier 7 which is connected to the bit lines connected to the memory cells of the memory cell array 1 so that the write amplifier 7 is operated to write data in 4-byte units into the designated memory cells. The semiconductor memory device also has a sense amplifier 8 which is connected to the bit lines connected to the memory cells of the memory cell array 1 so that the sense amplifier 8 is operated to read data in 4-byte units from the designated memory cells. The semiconductor memory device also has a data buffer 9 which is connected to the sense amplifier 8 for receiving the read data in 4-byte units and amplification of the data. The semiconductor memory device also has a read operation purpose latch circuit 5 which is connected to the data buffer 9 for receiving the read data in 4-byte units from the data buffer 9, so that the read operation purpose latch circuit 5 is operated to latch the read data for every 4-byte unit in synchronizing with the reference clock signals for time-sequential outputs of consecutive data from the read operation purpose latch circuit 5.

The semiconductor memory device also has a read/write control circuit 14 for generating control signals to switch read and write operations. The read/write control circuit 14 is connected to the write amplifier 7, the sense amplifier 8 and the data buffer 9 to send the control signals thereto. The semiconductor memory device also has a counter 15 for receiving the externally supplied reference clock signals for counting operation thereof to obtain a counted value 0, 1, 2, or 3 and further decode the counted value 0, 1, 2, or 3. The counter 15 is connected to the read/write control circuit 14 for receiving the control signal from the read/write control circuit 14. The counter 15 is also connected through five signal lines to the write operation purpose latch circuit 4 and the read operation purpose latch circuit 5 for sending the decoded count value and the control signal to the write operation purpose latch circuit 4 and the read operation purpose latch circuit 5.

Further, the semiconductor memory device has a data sequence switching circuit 6 for switching the sequence of 4-byte data. The data sequence switching circuit 6 is connected to the counter 15 for receiving the decoded count value and the control signal from the counter 15 and also connected to the decoder 11 for receiving the decoded address data from the less significant bits (A0 and A1), so that the data sequence switching circuit 6 is operated to switch the sequence of 4-byte data in accordance with the decoded address data, the decoded count value and the control signal. The data sequence switching circuit 6 is also connected to the write operation purpose latch circuit 4 as well as connected to the write amplifier 7. For the purpose of write operation, the data sequence switching circuit 6 receives the parallel data in 4-byte units from the write operation purpose latch circuit 4 for switching the sequence of 4-byte data in accordance with the decoded address data, the decoded count value and the control signal, so that the data sequence switching circuit 6 transmits the sequence-switched 4-byte data to the write amplifier 7.

Furthermore, the semiconductor memory device has a data sequence control circuit 16 for switching the sequence of 4-byte data. The data sequence control circuit 16 is connected to the counter 15 for receiving the decoded count value and the control signal from the counter 15 and also connected to the decoder 11 for receiving the decoded address data from the less significant bits (A0 and A1), so that the data sequence control circuit 16 is operated to switch the sequence of 4-byte data in accordance with the decoded address data, the decoded count value and the control signal. The data sequence control circuit 16 is also connected to the read operation purpose latch circuit 5.

For the read operation, the data sequence control circuit 16 switches the sequence of 4-byte read data latched in the read operation purpose latch circuit 5 in accordance with the decoded address data and the decoded count value, so that the read operation purpose latch circuit 5 outputs the read data in switched sequences.

In the above descriptions, all of the data have been stored in the write operation purpose latch circuit 4 before the data sequence switching circuit 6 is operated to switch the sequences of the data. Notwithstanding, it may alternatively be possible to designate data latching positions in registers (not illustrated) at the same time when the data are stored in the write operation purpose latch circuit 4, so that the 4-byte data are latched for subsequent direct transmission of the output from the write operation purpose latch circuit 4 to the write amplifier 7 in order to provide substantially the same effect as switching the sequences of the data, whereby the data are written into the memory cell array 1 with reduced number of the clocks.

The following description will focus on the operation of the above semiconductor memory device. The consecutive data D0, D1, D2, D3, - - - Dn are inputted into an input terminal of the semiconductor memory device in synchronizing with externally supplied reference clock signals, wherein the input terminal is connected to the write operation purpose latch circuit 4 and the read operation purpose latch circuit 5. The write operation purpose latch circuit 4 receives the sequential transmission of the consecutive data D0, D1, D2, D3, - - - Dn, so that the write operation purpose latch circuit 4 is operated to convert the consecutive data D0, D1, D2, D3, - - - Dn into parallel data in 4-byte units. The data sequence switching circuit 6 receives the parallel data in 4-byte units for switching the sequence of the 4-byte data in accordance with the decoded address data from the decoder 11 and the decoded count value from the counter 15. The data sequence switching circuit 6 transmits the sequence-switched 4-byte data to the write amplifier 7, so that the write amplifier 7 is operated to write the sequence-switched 4-byte data into the memory cells designated by the column decoder 2 and the row decoder 3.

In the meantime, for the read operation, the sense amplifier 8 is operated to read data in 4-byte unit from the designated memory cells. The data buffer 9 connected to the sense amplifier 8 receives the read data in 4-byte units for amplification of the data. The data buffer 9 transmits the amplified read data in 4-byte units to the read operation purpose latch circuit 5. The read operation purpose latch circuit 5 receives the read data in 4-byte units from the data buffer 9, so that the data sequence control circuit 16 generates a control signal which controls or switch sequences in output of the 4-byte read data in accordance with the decoded address data from the decoder 11 and the decoded count value from the clock counter 15, so that the read operation purpose latch circuit 5 shows sequence-switched outputs of the data in synchronizing with the reference clock signals.

The read/write control circuit 14 generates such control signals that the sense amplifier 8 is operated to read the next data from the memory cell array 1 during the switching operation to the 4-byte data by the data sequence switching circuit 6, and the read data are latched by the sense amplifier 8.

The operation of switching the sequence of the 4-byte data by the data sequence switching circuit 6 will be described. The data sequence switching circuit 6 is operated to calculate a logic value "EXOR" of both the less significant bits (A0 and A1) of the head address from the decoder 11 and the decoded count value from the counter 15 so that the data sequence switching circuit 6 switches the sequences of the 4-byte data in accordance with the calculated logic value "EXOR". FIG. 2 is a table illustrative of how operation of the data sequence switching circuit switches the sequences of the 4-byte data in accordance with the calculated logic value "EXOR". It is assumed that the 4-byte data "D0, D1, D2 and D3" are inputted into the data sequence switching circuit 6. The decoded count values from the counter 15 into the data sequence switching circuit 6 are always changed in the order of (0, 0), (0, 1), (1, 0) and (1, 1). If the less significant bits (A0 and A1) of the head address are (0, 0), then the logic value "EXOR" are changed in the order of (0, 0), (0, 1), (1, 0) and (1, 1) by changing the decoded count values of (0, 0), (0, 1), (1, 0) and (1, 1), whereby output of the data from the data sequence switching circuit 6 are in the order of D0, D1, D2, D3. If the less significant bits (A0 and A1) of the head address are (0, 1), then the logic value "EXOR" are changed in the order of (0, 1), (0, 0), (1, 1) and (1, 0) by changing the decoded count values of (0, 0), (0, 1), (1, 0) and (1, 1), whereby output of the data from the data sequence switching circuit 6 are in the order of D1, D0, D3, D2. If the less significant bits (A0 and A1) of the head address are (1, 0), then the logic value "EXOR" are changed in the order of (1, 0), (1, 1), (0, 0) and (0, 1) by changing the decoded count values of (0, 1), (0, 0), (1, 1) and (1, 0), whereby output of the data from the data sequence switching circuit 6 are in the order of D2, D3, D0, D1. If the less significant bits (A0 and A1) of the head address are (1, 1), then the logic value "EXOR" are changed in the order of (1, 1), (1, 0), (0, 1) and (0, 0) by changing the decoded count values of (0, 1), (0, 0), (1, 1) and (1, 0), whereby output of the data from the data sequence switching circuit 6 are in the order of D3, D2, D1, D0.

The above sequence-switched 4-byte data are written into an address designated by the less significant bits (A0 and A1) of the head address. It is assumed that an area "A" of the memory cell array 1 is allocated in order with "address 0", "address 4" and "address 8", and an area "B" of the memory cell array 1 is allocated in order with "address 1", "address 5" and "address 9", and an area "C" of the memory cell array 1 is allocated in order with "address 2", "address 6" and "address 10", and an area "D" of the memory cell array 1 is allocated in order with "address 3", "address 6" and "address 11". If the less significant bits (A0 and A1) of the head address are (1, 0) to designate the "address 2", then the data "D2" is stored into the area "C" of the memory cell array 1, and the data "D3" is stored into the area "D" of the memory cell array 1, and the data "D0" is stored into the area "A" of the memory cell array 1, and the data "D1" is stored into the area "B" of the memory cell array 1. As described here, even if the data D0, D1, D2, D3 are inputted in any sequences, then the data sequence switching circuit 6 switches the sequence of the data D0, D1, D2, D3 so that the individual data D0, D1, D2, D3 are stored into the areas "A", "B", "C" and "D" corresponding to those addresses.

The subsequent descriptions will be directed to the data read operation of the semiconductor memory device. If the less significant bits (A0 and A1) of the head address are (0, 0) to designate the "address 0", then the data D0 stored in the area "A" of the memory cell array 1 is first outputted, and then the data D1 stored in the area "B" of the memory cell array 1 is outputted, and subsequently the data D2 stored in the area "C" of the memory cell array 1 is outputted, and finally the data D3 stored in the area "D" of the memory cell array 1 is outputted. If the less significant bits (A0 and A1) of the head address are (0, 1) to designate the "address 1", then the data D1 stored in the area "B" of the memory cell array 1 is first outputted, and then the data D0 stored in the area "A" of the memory cell array 1 is outputted, and subsequently the data D3 stored in the area "D" of the memory cell array 1 is outputted, and finally the data D2 stored in the area "C" of the memory cell array 1 is outputted. If the less significant bits (A0 and A1) of the head address are (1, 0) to designate the "address 2", then the data D2 stored in the area "C" of the memory cell array 1 is outputted, and then the data D3 stored in the area "D" of the memory cell array 1 is outputted, and subsequently the data D0 stored in the area "A" of the memory cell array 1 is outputted, and finally the data D1 stored in the area "B" of the memory cell array 1 is outputted. If the less significant bits (A0 and A1) of the head address are (1, 1) to designate the "address 3", then the data D3 stored in the area "D" of the memory cell array 1 is first outputted, and then the data D2 stored in the area "C" of the memory cell array 1 is outputted, and subsequently the data D1 stored in the area "B" of the memory cell array 1 is outputted, and finally the data D0 stored in the area "A" of the memory cell array 1 is outputted. As described here, even if any address is designated, then the data corresponding to any designated address is first outputted.

In the above embodiment, the 4-byte data are concurrently written into and read out from the memory cell array 1. Namely, the number of the data concurrently written into and read out from the memory cell array 1 is four. If m-byte data are concurrently written into and read out from the memory cell array 1 or the number of the data concurrently written into and read out from the memory cell array 1 is "m", then the data sequence switching circuit 6 is operated to calculate the exclusive OR of both the less significant bits and the output from the clock counter, wherein the number of the less significant bits is defined to be $\log_2 m$, so as to decide the sequences in output of the data in accordance with the calculated logic value "EXOR".

If, as described above, the data D0, - - - Dn are read out in the 4-byte units by the CPU (not illustrated), then available units or sets of data for being concurrently written into or read out from the memory cell array 1 are fixed to be D0 to D3, D4 to D7, and Dn–3 to Dn, provided that the available units or sets of data for being concurrently written into or read out from the memory cell array 1 are such that no switching operation of the word lines is necessary.

In accordance with the present invention, the data of the next set are stored into the sense amplifier 8 during when the data sequence switching circuit 6 is operated to switch the sequences of the data of the previous set and subsequently the read operation purpose latch circuit 5 latches the sequence-switched data of the previous set, for which reason the CPU is permitted to continuously fetch the data, thereby increasing a freedom of the external data bus.

The data sequence switching circuit 6 utilizes a simple logic operation to switch the sequences of the data, for which reason a high speed processing is realizable even if the number of the bytes of the data to be burst-transmitted.

As a first modification, as illustrated in FIG. 3, each of the data sequence switching circuit 6 and the data sequence control circuit 6 may comprise a switching network comprising a plurality of switches 17, each of which has input and output paths previously set, so that the switching network is capable of selecting any one of plural patterns in accordance with the decoded data of the less significant bits, for example, (A0, A1). Namely, in this case, the data sequence switching circuit 6 does not need the clock counted value to select any one of the plural patterns. The switching network has such a configuration that the data are outputted in the same sequences as when the sequences in output of the data are determined in accordance with the logic values "EXOR" of the less significant bits and the output from the clock counter 15. If m-byte data are concurrently written into and read out from the memory cell array 1 or the number of the data concurrently written into and read out from the memory cell array 1 is "m", then the number of the necessary switches 17 is $m^2$. The increase in the number of the data concurrently written into and read out from the memory cell array 1 results in an exponential increase in the number of the necessary switches 17. Notwithstanding, in accordance with the above embodiment, the single data sequence switching circuit 6 is commonly used for both write and read operations to reduce the occupied area of the circuit. The switch 17 may comprise either a single transistor or transfer gates or logic gates.

In accordance with the above embodiment, the read data are transmitted from the sense amplifier 8 through the data buffer 9 to the data sequence switching circuit 6. It is possible to temporary latch the data in the data buffer 9 before transmission into the data sequence switching circuit 6. In this case, it is possible to prepare the operation of reading the data from the memory cells connected to the word lines during when the data sequence switching circuit 6 is operated to switch the sequences of the data.

In accordance with the above embodiment, even if the CPU needs only the datum D3, then the consecutive data D0, D1, D2 and D3 are concurrently outputted. Notwithstanding, the CPU is allowed to ignore the data D0, D1, D2 or to make a copy of the data D0, D1, D2 in a primary cache memory accommodated in the CPU.

The above novel semiconductor memory device provides the following advantages.

Each of the data sequence switching circuit 6 and the data sequence control circuit 16 is operated to switch the sequences of the data in set for being concurrently written into and read out from the memory cell array so that the CPU is allowed to first fetch the data designated by the less significant bits of the head address and sub sequent consecutive fetching of the remaining data in the switched sequences without, however, switching the selected word line.

The data sequence switching circuit 6 shows a simple logic operation of calculating the EXOR of the less significant bits of the head address and the output from the clock counter, wherein the number of the less significant bits is decided to be $\log_2 m$, so that the data sequence switching circuit 6 decides the sequences of the data in accordance with the calculated "EXOR".

Not only the data sequence switching circuit 6 is provided for switching the sequences of the data in the data write operation but also the data sequence control circuit 16 is separately provided for switching the sequences of the data in the data read operation, so that even if the number of the data concurrently written into or read out from the memory cell array 1 is increased, then any increase in the necessary area of the data sequence switching circuit 6 may be suppressed.

The data read out line of the above semiconductor memory device has no transistors constituting the data sequence switching circuit 6. This realize a minimum wiring distance on circuit design, thereby reducing the chip area and also suppressing any delay in signal transmission on the wiring.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor memory device for arranging a sequence of digital data that is to be transmitted as a unit during one of a read and write operation, the device comprising:

a memory cell array;

a write-data latch circuit receiving in serial form a sequence of data and providing in parallel form plural unit data each comprising plural bytes, the sequence of data being synchronized with an external clock signal;

an address decoder decoding least significant bits of an address of an initial one of the sequence of data;

a clock counter counting clock cycles of the external clock signal;

a data sequence switching circuit connected to said write-data latch circuit, said address decoder, and said clock counter, said data sequence switching circuit logically combining a count from said clock counter and the least significant bits of the address for storing the initial one of the sequence of data in said memory cell and arranging the sequence of data based on the logical combination; and a read-data latch circuit connected to said data sequence switching circuit for converting data in parallel form from said data sequence switching circuit to data in serial form for output from the device.

2. The device of claim 1, wherein said data sequence switching circuit executes an EXOR operation for making the logical combination.

3. The device of claim 1, further comprising a data buffer circuit between said memory cell array and said data sequence switching circuit latching read data from said memory cell array.

* * * * *